(12) United States Patent
Tabery et al.

(10) Patent No.: US 7,855,048 B1
(45) Date of Patent: Dec. 21, 2010

(54) WAFER ASSEMBLY HAVING A CONTRAST ENHANCING TOP ANTI-REFLECTING COATING AND METHOD OF LITHOGRAPHIC PROCESSING

(75) Inventors: Cyrus E. Tabery, Santa Clara, CA (US); Bruno M. LaFontaine, Pleasanton, CA (US); Adam R. Pawloski, San Jose, CA (US); Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1961 days.

(21) Appl. No.: 10/838,704

(22) Filed: May 4, 2004

(51) Int. Cl.
 *G02F 1/01* (2006.01)
(52) U.S. Cl. .......................... 430/396; 430/4; 430/311
(58) Field of Classification Search ................ None
 See application file for complete search history.

(56) References Cited

U.S. PATENT DOCUMENTS

| | | | |
|---|---|---|---|
| 6,576,376 | B1 | 6/2003 | Kim |
| 6,599,766 | B1 | 7/2003 | Tabery et al. |
| 2002/0012875 | A1* | 1/2002 | Pavelchek et al. ........ 430/270.1 |
| 2003/0161029 | A1* | 8/2003 | Kurtz et al. ................. 359/290 |
| 2004/0165271 | A1* | 8/2004 | Krautschik et al. .......... 359/580 |
| 2005/0202351 | A1* | 9/2005 | Houlihan et al. ............ 430/322 |

* cited by examiner

*Primary Examiner*—Daborah Chacko Davis
(74) *Attorney, Agent, or Firm*—Farjami & Farjami LLP

(57) ABSTRACT

A method of fabricating a semiconductor device using lithography. The method can include providing a wafer assembly having a layer to be processed disposed under a photo resist layer and illuminating the wafer assembly with an exposure dose transmitted through a birefringent material disposed between a final optical element of an imaging subsystem used to transmit the exposure dose and the photo resist layer. Also disclosed is a wafer assembly from which at least one semiconductor device can be fabricated. The wafer assembly can include a layer to be processed, a photo resist layer disposed over the layer to be processed and a contrast enhancing, birefringent top anti-reflecting coating (TARC).

15 Claims, 2 Drawing Sheets

WAFER ASSEMBLY HAVING A CONTRAST ENHANCING TOP ANTI-REFLECTING COATING AND METHOD OF LITHOGRAPHIC PROCESSING

TECHNICAL FIELD

The present invention relates generally to the field of integrated circuit manufacture and, more particularly, to a contrast enhancing top anti-reflecting coating (TARC) having birefringent properties that can be used to improve lithographic processing of a wafer when a numerical aperture (NA) of the lithography system is relatively high.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photo resist layer disposed on the wafer by passing light energy through a mask having an arrangement to image the desired pattern onto the photo resist layer. As a result, the pattern is transferred to the photo resist layer. After a development cycle, the photo resist material can be selectively removed to expose an underlying layer (e.g., a semiconductor layer, a metal or metal containing layer, a dielectric layer, a hard mask layer, etc.). Portions of the photo resist layer that are not removed serve to protect the underlying layer during further processing of the wafer (e.g., etching exposed portions of the underlying layer, implanting ions into the wafer, etc.). Thereafter, the remaining portions of the photo resist layer can be removed.

There is a pervasive trend in the art of IC fabrication to increase the density with which various structures are arranged. For example, feature size, line width, and the separation between features and lines are becoming increasingly smaller. For example, nodes with a critical dimension (CD) of about 45 nanometers (nm) to about 65 nm have been proposed.

To assist in forming structures with a small CD, various lithographic techniques and optical parameters have been employed. For instance, use of a relatively small illumination wavelength (e.g., 193 nm) has been proposed in conjunction with a relatively high numerical aperture (NA), such as about 0.6 to about 0.95 or even higher. Unfortunately, this combination of optical parameters can lead to a reduction in contrast of the image incident on the photo resist.

Accordingly, there exists a need in the art for improved techniques and wafer assemblies for imaging a pattern onto a layer of photo resist using lithography.

SUMMARY OF THE INVENTION

According to one aspect of the present invention, the invention is directed to a method of fabricating a semiconductor device using lithography. The method can include providing a wafer assembly having a layer to be processed disposed under a photo resist layer; and illuminating the wafer assembly with an exposure dose, the exposure dose transmitted through a birefringent material disposed between a final optical element of an imaging subsystem used to transmit the exposure dose and the photo resist layer. In one embodiment, the birefringent material comprises a top anti-reflecting coating (TARC) disposed over the photo resist layer and forms a part of the wafer assembly.

According to another aspect of the present invention, the invention is directed to a wafer assembly from which at least one semiconductor device can be fabricated. The wafer assembly can include a layer to be processed; a photo resist layer disposed over the layer to be processed; and a contrast enhancing top anti-reflecting coating (TARC), wherein the TARC is birefringent.

BRIEF DESCRIPTION OF DRAWINGS

These and further features of the present invention will be apparent with reference to the following description and drawings, wherein.

DISCLOSURE OF INVENTION

Figure 1:
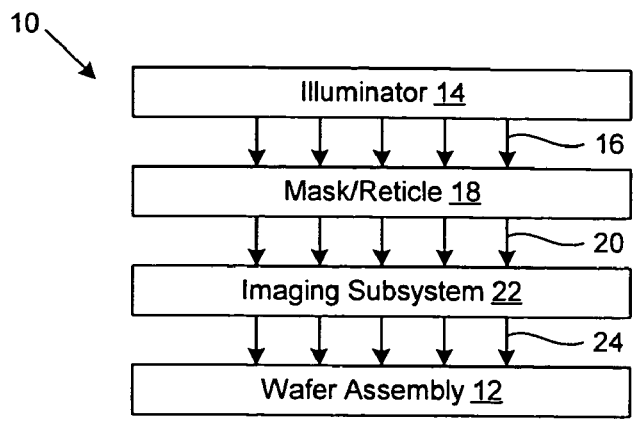
FIG. 1 is a schematic block diagram of a exemplary integrated circuit processing arrangement.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The present invention relates to assemblies and methods for improving image contrast during lithographic processing that involves a relatively small wavelength and a relatively high numerical aperture (NA). More specifically, a top anti-reflective coating (TARC) can be disposed over a photo resist layer to be imaged. The TARC can have birefringent properties so that a high contrast polarization state of radiation incident on the TARC can be transmitted to the photo resist layer. In addition, a lower contrast polarization state of radiation incident on the TARC can be effectively attenuated by, for example, destructive interference. In another embodiment, a wafer having a TARC disposed over a photo resist layer can be imaged using an immersion lithography system.

The present invention will be described in the exemplary context of the process for manufacturing an integrated circuit (or at least one microdevice for an integrated circuit), and more specifically in the exemplary context of patterning a layer of material (e.g., a polysilicon gate or word line layer, a dielectric layer, a source/drain layer, a metal interconnect layer, a contact layer, etc.) that forms a part of the integrated circuit (or microdevice). Example integrated circuits include general use processors made from thousands or millions of transistors, a flash memory array or any other dedicated circuitry. However, one skilled in the art will appreciate that the methods, materials and assemblies described herein can also be applied to the process of manufacturing any article made using photolithography, such as micromachines, disk drive heads, gene chips, micro electro-mechanical systems (MEMS) and so forth.

Referring to FIG. 1, illustrated is a schematic block diagram of an exemplary integrated circuit processing arrangement that includes a lithography system 10 used to image a pattern onto a wafer assembly 12, or a region thereof. The wafer assembly 12 can include a substrate, layers to form an integrated circuit, a photo resist layer and any other appropriate layers. The lithography system 10 can be a dry lithography system where radiation incident on the wafer traverses a gas medium or a vacuum. Alternatively, the lithography system 10 can be an immersion lithography system where radiation incident on the wafer traverses an immersion medium.

The system 10 illustrated in FIG. 1 is a dry lithography system and can be, for example, a step-and-repeat exposure system or a step-and-scan exposure system, but is not limited to these example systems. The system 10 can include an illuminator 14 for directing radiation in the form of energy 16 towards a photomask 18. For purposes of simplicity, the terms radiation, energy and light will be used interchangeably, even though the output of the illuminator 14 may not be in the visible portion or even the ultraviolet portion of the electromagnetic spectrum. The energy 16 can have, for example, a deep ultraviolet wavelength (e.g., about 248 nm or about 193 nm), or a vacuum ultraviolet (VUV) wavelength (e.g., about 157 nm), although other wavelengths, including extreme ultraviolet wavelengths, are possible.

The mask 18 selectively blocks (or, in some instances, selectively reflects) the energy 16 such that an energy pattern 20 defined by the mask 18 is transferred towards the wafer 12. An imaging subsystem 22, such as a stepper assembly or a scanner assembly, sequentially directs the energy pattern 20 transmitted by the mask 18 to a series of desired locations on the wafer assembly 12. The imaging subsystem 22 may include a series of lenses and/or reflectors for use in scaling and directing the energy pattern 20 towards the wafer assembly 12 in the form of an exposure dose 24.

Figure 2:
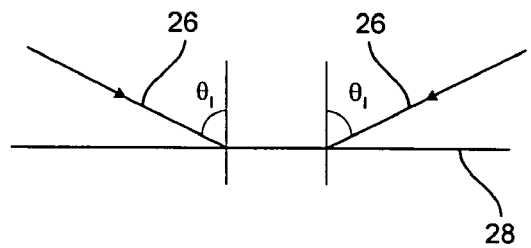
FIG. 2 is a schematic diagram of radiation imaged onto a plane at a relatively high angle.

The imaging subsystem 22 can have a relatively high NA, such as, in one embodiment, an NA of greater than about 0.6, and in another embodiment an NA of about 0.6 to about 0.95. With additional reference to FIG. 2, shown is an enlarged view of light rays 26 from the exposure dose 24 imaged onto a plane 28. The relatively high NA increases the angle ($\theta_i$) with which the rays 26 are incident of the plane 28. The angle of incidence can be near or equal to Brewster's angle ($\theta_B$). If one were to assume that the plane 28 were the upper surface of a layer of photo resist material to be image with the exposure dose, the unpolarized light incident on the photo resist can be partially polarized upon transmission into the photo resist. More specifically, at such a large angle, light with a parallel polarization state ($E_\parallel$) (e.g., light that is polarized parallel to the photo resist's surface) can be at least partially reflected off of the upper surface of the photo resist and/or out of the photo resist (e.g., by an internal reflection at a lower surface of the photo resist). Light with a perpendicular polarization state ($E_\perp$) (e.g., light that is polarized perpendicular to the photo resist's surface) can be at least partially transmitted into the photo resist. Unfortunately, the contrast achievable with light of the parallel polarization state is higher than the contrast achievable with light of the perpendicular polarization state. The difference in contrast results from the principle that the electric field (E) of light beams add as vectors at relatively high angles. As a result, the image left by the exposure dose 24 may have relatively low contrast.

Figure 3:
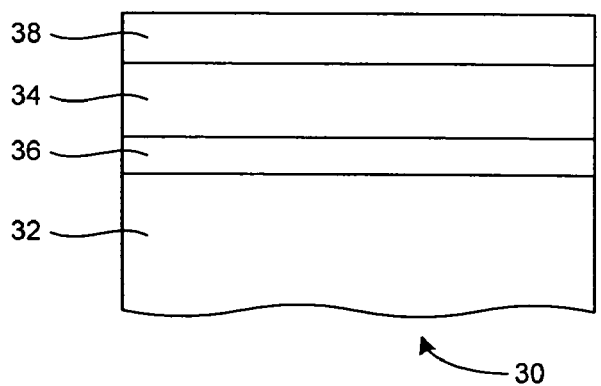
FIG. 3 is a schematic block diagram of a wafer assembly according to the present invention.

Turning now to FIG. 3, illustrated is a wafer assembly 30 having a structure to improve contrast in the high NA environment described above. The wafer assembly 30 can include a substrate 32. As used herein, the term substrate explicitly includes a material layer to be processed using lithographic techniques. Therefore, the substrate 32 can include a base layer or layer(s) of material upon which and/or from an integrated circuit is fabricated. The base layer(s) can include, for example, a bulk silicon layer or a semiconductor-on-insulator assembly. The substrate 32 can also include layers formed over the base layer(s), such as one or more dielectric layers, one or more contact layers, one or more metal layers, one or more semiconductor layers, a hard mask layer, and so forth.

A light sensitive (or detector) layer, such as a layer of photo resist material 34, can be formed over the substrate 32. A bottom anti-reflective coating (BARC) 36 can be formed between the substrate 32 and the photo resist 34. In some arrangements, the BARC 36 can be omitted. In other arrangements, other layers can be disposed between the substrate 32 and the photo resist 34, such as a primer and/or an interface layer(s).

A top anti-reflective coating (TARC) 38 can be formed over the photo resist 34. The TARC 38 preferably has birefringent properties (e.g., the material is characterized by two or more indices of refraction). The birefringent properties can be selected such that light with a parallel polarization state ($E_\parallel$) can be at least partially transmitted to the underlying photo resist 34. The birefringent properties can be further selected such that light with a perpendicular polarization state ($E_\perp$) can be at least partially reflected away from the photo resist 34 and/or attenuated, such as by destructive interference. In other arrangements, other layers can be disposed between the TARC 38 and the photo resist 34, such as a primer and/or an interface layer(s).

Figure 4:
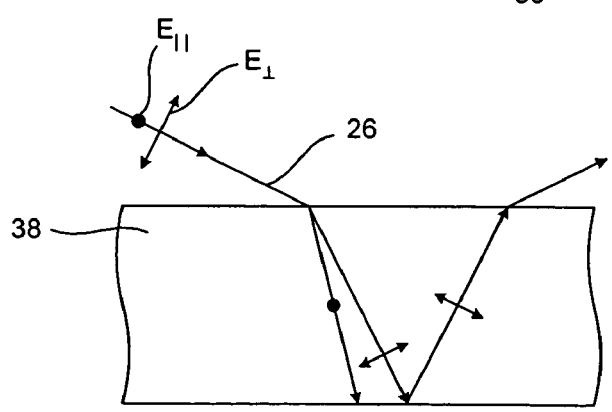
FIG. 4 is a schematic diagram of an interaction of radiation with a top anti-reflecting coating (TARC) of the wafer assembly.

With additional reference to FIG. 4, shown is an enlarged view of an example ray 26 from the exposure dose 24 incident on the birefringent TARC 38. In some situations, the ray 26 can be considered to be a composite of multiple rays. The ray 26 includes a parallel polarization state ($E_\parallel$) component (indicated by a dark circle and sometimes referred to in the art as an ordinary ray) and a perpendicular polarization state ($E_\perp$) (indicated by a double ended arrow and sometime referred to in the art as an extraordinary ray). Upon incidence with the TARC 38, at least a portion of the parallel polarization state component can enter the TARC 38. Although not illustrated, a portion of the parallel polarization state can be reflected by an upper surface of the TARC 38. The parallel polarization state component of the ray 26 can traverse the TARC 38 at an angle governed by an index of refraction corresponding to the parallel polarization state component, which is sometimes referred to in the art as the ordinary index of refraction ($n_O$). Thereafter, the parallel polarization state component can exit the TARC 38 through a lower surface of the TARC 38 and become incident on and/or enter the photo resist 34. Although not illustrated, a portion of the parallel polarization state can be reflected at the lower surface of the TARC 38.

Upon incidence with the TARC 38, at least a portion of the perpendicular polarization state ($E_\perp$) component can enter the TARC 38. Although not illustrated, a portion of the perpendicular polarization state can be reflected by an upper surface of the TARC 38. The perpendicular polarization state component of the ray 26 can traverse the TARC 38 at an angle governed by an index of refraction corresponding to the perpendicular polarization state component, which is sometimes referred to in the art as the extraordinary index of refraction ($n_E$). Thereafter, a significant portion of the perpendicular polarization state can be reflected at the lower surface of the TARC 38 (e.g., at the interface of the TARC 38 and the photo resist 34) such that the perpendicular polarization state component becomes directed back towards the upper surface of the TARC 38. At the upper surface of the TARC 38, the perpendicular polarization state component can exit the TARC 38. The reflected portion of the perpendicular polarization state component may interfere destructively with incoming light that has a perpendicular polarization state component, thereby attenuating the overall perpendicular polarization state component present in and/or adjacent the TARC 38. Although not illustrated, a portion of the perpendicular polarization state component that is incident on the lower surface of the TARC 38 can be transmitted into the photo resist 34.

As should be appreciated, the properties of the TARC 38 promote the transmission of exposure dose components that have a relatively high contrast. In addition, the properties of the TARC 38 can be established to promote the reduction of exposure dose components that have a relatively low contrast.

The thickness of the TARC 38 can be selected to assist in achieving the foregoing optical properties of the TARC 38. In one embodiment, the thickness of the TARC 38 from the upper surface to the lower surface can be about that of a quarter wave plate. The thickness of a quarter wave plate can be defined by equation 1, where $T_p$ is the thickness, $\lambda$ is the wavelength of the exposure dose 24, $n_O$ is the ordinary index of refraction and $n_E$ is the extraordinary index of refraction.

$$T_P = \lambda/4(n_O - n_E) \qquad \text{Eq. 1}$$

In most situations, the thickness of the quarter wave plate implemented with the TARC 38 can be about two to about ten times thicker than the wavelength of the exposure dose.

In another embodiment, the thickness of the TARC 38 from the upper surface to the lower surface can be about that of a quarter wave film. The thickness of a quarter wave film can be defined by equation 2, where $T_F$ is the thickness, $\lambda$ is the wavelength of the exposure dose 24, $n_A$ is the average of the ordinary index of refraction and the extraordinary index of refraction.

$$T_F = \lambda/4(n_A) \qquad \text{Eq. 2}$$

In most situations, the thickness of the quarter wave film implemented with the TARC 38 can be about one-eighth to about one half the wavelength of the exposure dose. In another embodiment, the thickness of the TARC 38 can be in the range of about that of a quarter wave film to about that of a quarter wave plate.

Preferably, the TARC 38 is transparent at the exposure wavelength and has little chemical interaction with the photo resist 34 (e.g., minimally contaminates the photo resist). The difference between the ordinary index of refraction and the extraordinary index of refraction is preferably as large as possible to maximize the birefringent effect of the TARC 38. The TARC 38 can be implemented using purely birefringent materials or conventional TARC materials that have been enhanced with birefringent materials. For example, any suitable enantiomeric material (including acrylic acids arranged in functional groups to form enantiomers), cyclo-olefins, and acrylates can be used to impart birefringency to the TARC 38.

Figure 5:
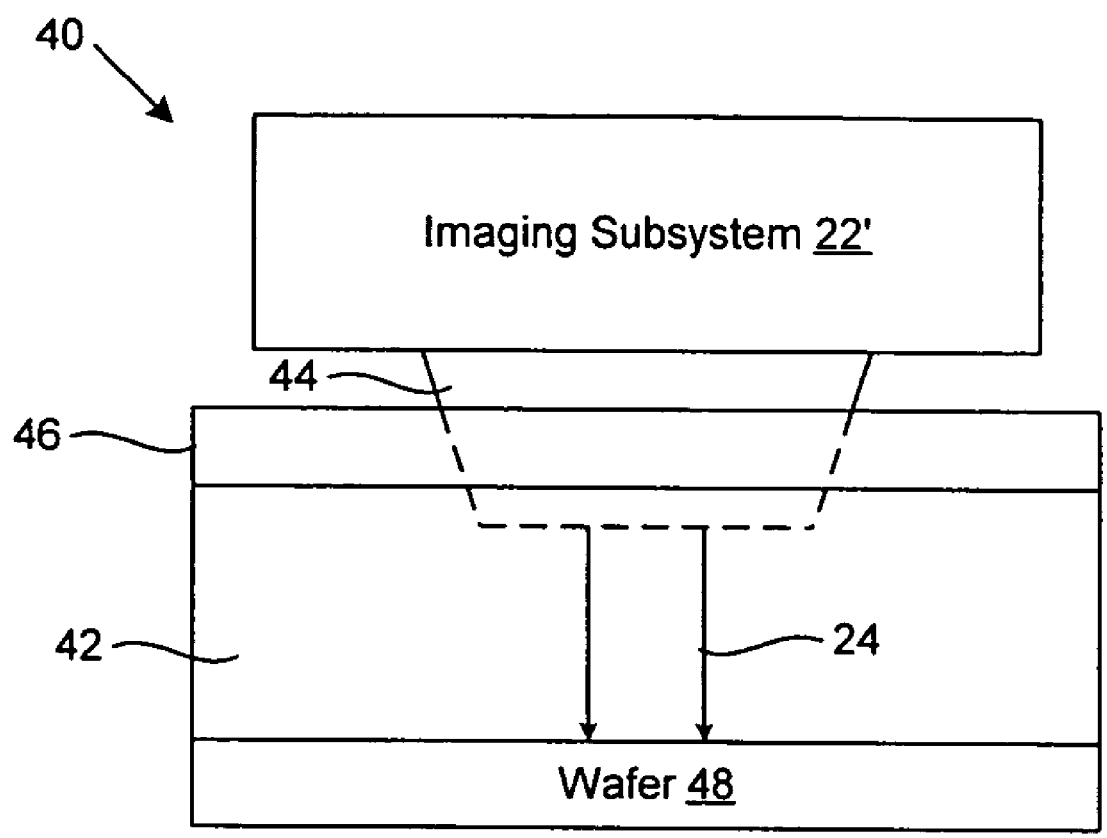
FIG. 5 is a schematic diagram of an immersion lithography system according to the invention.

As indicted, birefringent material can be used to improve contrast in the dry lithography system described above as well as immersion lithography systems. With additional reference to FIG. 5, illustrated is a portion of a liquid immersion medium lithography system 40. The system 40 can be implemented with an illuminator, mask and imaging subsystem as found in the system 10 except that the exposure dose 24 is transmitted through an immersion fluid, or immersion medium 42. The immersion medium 42 can be a liquid. In one example, purified de-ionized water can be used in conjunction with a 193 nm light source (e.g., an argon fluorine (ArF) laser). In another example, polyfluoroethers can be used in conjunction with a 157 nm light source.

The imaging subsystem 22' can include an output lens 44, or other final optical structure. At least a portion of the imaging subsystem 22', including the lens 44, can enter a chamber 46 containing the immersion medium 42 and a wafer assembly 48. The lens 44 can be in intimate contact with the immersion medium 42 such that the exposure dose 24 output by the lens 44 is projected through the immersion medium 42 and is incident onto at least a portion of the wafer assembly 48, which is disposed under or immersed in the immersion medium 42. The imaging subsystem 22' can have a relatively high NA, such as, in one embodiment, an NA of greater than about 0.6, in one embodiment, an NA of greater than about 0.95, in another embodiment, an NA of about 0.6 to about 1.5, in another embodiment, an NA of about 0.95 to about 1.3, and, in another embodiment, an NA of about 0.95 to about 1.5. It is noted that, in some cases, the NA of the imaging system 22' used in conjunction with an immersion lithography technique may be higher than that of the imaging system 22 used in conjunction with a dry lithography technique due to a relatively high index of refraction of the immersion medium. As described above with respect to the imaging system 22, the NA of the imaging subsystem 22' can lead to diminished contrast of the exposure dose 24.

The wafer 48 can be constructed in the same manner as the wafer 30 such that the wafer 48 includes at least a layer to be processed that underlies a photo resist layer. A birefringent TARC, such as the TARC 38, can be disposed over the photo resist layer to improve contrast of the exposure dose 24 that becomes incident on the photo resist of the wafer assembly 48.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating a semiconductor device using lithography, comprising:
   providing a wafer assembly having a layer to be processed disposed under a photo resist layer; and
   illuminating the wafer assembly with an exposure dose, the exposure dose transmitted through a birefringent material disposed between a final optical element of an imaging subsystem used to transmit the exposure dose and the photo resist layer.

2. The method according to claim 1, wherein the birefringent material comprises a top anti-reflecting coating (TARC) disposed over the photo resist layer and forming a part of the wafer assembly.

3. The method according to claim 2, wherein a thickness of the TARC is about that of a quarter wave plate, a thickness of the quarter wave plate defined by the equation:

$$\lambda/4(n_O - n_E)$$

wherein $\lambda$ is a wavelength of the exposure dose, $n_O$ is an ordinary index of refraction of the birefringent material and $n_E$ is an extraordinary index of refraction of the birefringent material.

4. The method according to claim 2, wherein a thickness of the TARC is about that of a quarter wave film, a thickness of the quarter wave film defined by the equation:

$$\lambda/4(n_A)$$

wherein λ is a wavelength of the exposure dose and $n_A$ is an average of an ordinary index of refraction of the birefringent material and an extraordinary index of refraction of the birefringent material.

5. The method according to claim 2, wherein a thickness of the TARC is from about that of a quarter wave plate, a thickness of the quarter wave plate defined by the equation:

$$\lambda/4(n_O-n_E)$$

to about that of a quarter wave film, a thickness of the quarter wave film defined by the equation:

$$\lambda/4(n_A)$$

wherein λ is a wavelength of the exposure dose, $n_O$ is an ordinary index of refraction of the birefringent material, $n_E$ is an extraordinary index of refraction of the birefringent material, and $n_A$ is an average of the ordinary index of refraction of the birefringent material and the extraordinary index of refraction of the birefringent material.

6. The method according to claim 2, wherein the TARC is comprised of an enantiomer.

7. The method according to claim 2, wherein the imaging subsystem has a numerical aperture of greater than about 0.6.

8. The method according to claim 7, wherein the TARC transmits an effective amount of a parallel polarization state component of the exposure dose to activate the photo resist.

9. The method according to claim 8, wherein the TARC attenuates at least a portion of a perpendicular polarization state component of the exposure dose.

10. The method according to claim 7, wherein the TARC attenuates at least a portion of a perpendicular polarization state component of the exposure dose.

11. The method according to claim 2, further comprising providing an immersion medium between and in contact with the final output element of the imaging subsystem and the wafer assembly such that the exposure dose traverses the immersion medium.

12. The method according to claim 11, wherein the imaging subsystem has a numerical aperture of greater than about 0.6.

13. The method according to claim 12, wherein the TARC transmits an effective amount of a parallel polarization state component of the exposure dose to activate the photo resist.

14. The method according to claim 13, wherein the TARC attenuates at least a portion of a perpendicular polarization state component of the exposure dose.

15. The method according to claim 12, wherein the TARC attenuates at least a portion of a perpendicular polarization state component of the exposure dose.

* * * * *